United States Patent [19]

Okuyama et al.

[11] Patent Number: 4,637,124
[45] Date of Patent: Jan. 20, 1987

[54] PROCESS FOR FABRICATING SEMICONDUCTOR INTEGRATED CIRCUIT DEVICE

[75] Inventors: Kousuke Okuyama, Tachikawa; Norio Suzuki, Koganei; Satoshi Meguro, Tokyo; Kouichi Nagasawa, Kunitachi, all of Japan

[73] Assignee: Hitachi, Ltd., Tokyo, Japan

[21] Appl. No.: 712,760

[22] Filed: Mar. 18, 1985

[30] Foreign Application Priority Data

Mar. 16, 1984 [JP] Japan .................. 59-49042

[51] Int. Cl.$^4$ ........................... H01L 21/38
[52] U.S. Cl. .................. 29/571; 29/577 C; 148/187
[58] Field of Search ............ 29/591, 577 C; 148/187

[56] References Cited

U.S. PATENT DOCUMENTS

| | | | |
|---|---|---|---|
| 4,366,613 | 1/1983 | Ogura et al. | 29/571 |
| 4,488,351 | 12/1984 | Momose | 29/578 |
| 4,505,024 | 3/1985 | Kawate et al. | 29/571 |
| 4,525,920 | 7/1985 | Jacobs et al. | 29/571 |
| 4,530,150 | 7/1985 | Shirato | 29/576 B |
| 4,536,944 | 8/1985 | Bracco et al. | 29/571 |

OTHER PUBLICATIONS

Yamaguchi et al., IEDM, Wn.D.C., Dec. 5–7, 1983, pp. 522–525.
Tsang et al., IEEE Trans. on Electron Devices, vol. ED-29, No. 4, Apr. 1982, pp. 590–596.

*Primary Examiner*—George T. Ozaki
*Attorney, Agent, or Firm*—Antonelli, Terry & Wands

[57] ABSTRACT

Herein disclosed is a process for fabricating a semiconductor integrated circuit device which is provided with N-channel and P-channel MISFETs each having a pair of side wall spacers formed simultaneously at both the sides of a gate electrode thereof. The P-channel MISFET has its source and drain regions formed by a boron ion implantation using the gate electrode and the paired side wall spacers as a mask. The boron having a high diffusion velocity is suppressed from diffusing below the gate electrode.

16 Claims, 10 Drawing Figures

PROCESS FOR FABRICATING SEMICONDUCTOR INTEGRATED CIRCUIT DEVICE

BACKGROUND OF THE INVENTION

The present invention relates to a technique which is effective for application to a semiconductor integrated circuit device, hereafter referred to as an "IC", and more particularly, to a fabrication technique which is effective for application to an IC provided with an insulated gate field effect transistor, a metal insulator semiconductor field effect transistor hereinafter referred to as a "MISFET".

In the MISFET, there arises a problem in the geometric overlap between a gate electrode and source and drain regions. This problem becomes serious especially in case the source and drain regions of a fine MISFET having a channel length of 1.0 μm are formed by an ion implantation using the gate electrode as a mask.

With an annealing treatment after the implantation, implanted impurities will diffuse below the gate electrode, i.e., into a channel region. As a result, an effective channel length is reduced to induce a short channel effect.

Because of the high diffusion velocity of boron ions in silicon, the short channel effect becomes an especially serious problem in a fine P-channel MISFET having boron ion implanted in forming the source and drain regions.

SUMMARY OF THE INVENTION

An object of the present invention is to provide a technique which forms an IC provided with a MISFET, e.g., a P-channel MISFET, to retain a sufficient effective channel length for the P-channel MISFET so as to prevent the short channel effect, as well as the device produced thereby.

Another object of the present invention is to provide a technique which forms an IC provided with an N-channel MISFET and a P-channel MISFET and which retains a sufficient effective channel length for the P-channel MISFET so as to prevent the short channel effect, as well as the device produced thereby.

Still another object of the present invention is to provide a technique which forms an IC provided with an N-channel MISFET and a P-channel MISFET and which retains sufficient effective channel lengths for the N-channel and P-channel MISFETs so as to prevent the short channel effect, as well as the device produced thereby.

The aforementioned and other objects and novel features of the present invention will become apparent from the following description taken with reference to the accompanying drawings.

An example of the invention to be disclosed herein will be summarized in the following. However, as can be appreciated, the present invention is not limited thereto.

An impurity for forming the drain or source region of the P-channel MISFET is introduced into a semiconductor substrate by using as a mask the gate electrode and side wall spacers formed at both sides of the gate electrode. Such side wall spacers can be used, also, with P-channel MISFETs formed in complementary MIS ICs, as well as both the P-channel and N-channel MISFETs of such complementary MIS ICs. The side wall spacers extend a sufficient distance from the electrode sides so that, during formation of the source and/or drain regions, the impurity ions do not move into the channel region to cause the short channel effect.

As a result, the source or drain region is suppressed from extending into the region to be formed with the channel. As a result, the effective channel length can be retained at a sufficient value to prevent the short channel effect of the MISFET.

DETAILED DESCRIPTION OF THE INVENTION

Figure 1:
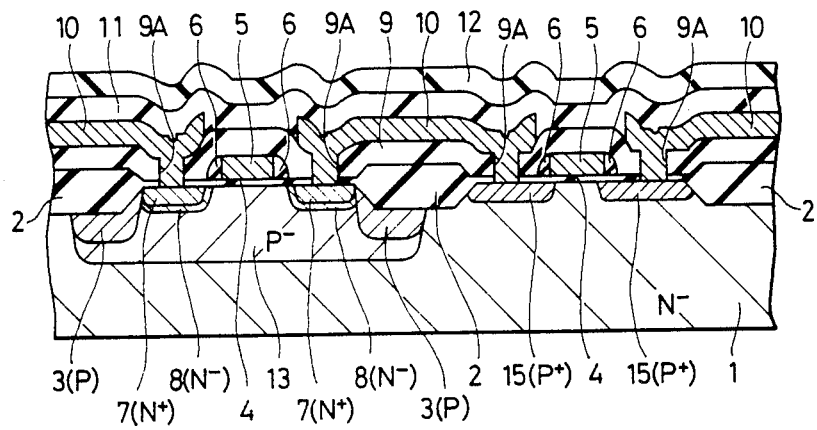
FIG. 1 is a sectional view showing an IC provided with a complementary MISFET for explaining a first embodiment of the present invention.

The present invention will be described in that aspect thereof of its being applied to an IC provided with a complementary MISFET.

Incidentally, through the Figures, parts or portions having identical functions are indicated with identical reference characters, and their repeated description is omitted.

FIG. 1 is a sectional view showing an essential portion of an IC provided with a CMIS (e.g., a complementary MISFET) for explaining a first embodiment of the present invention.

In FIG. 1, reference numeral 1 indicates an $N^-$-type semiconductor substrate, hereafter referred to as a "substrate", which is made of single crystal silicon, for forming a part of the IC.

Indicated at numeral 13 is a $P^-$-type well region which is formed in a predetermined main surface portion of the substrate 1 to form a part of an N-channel MISFET.

Indicated at numeral 2 is a field insulating film which is formed on the main surface of the substrate 1 between the regions which are to be formed with semiconductor elements such as MISFETs, thereby to electrically separate the semiconductor elements. Indicated at numeral 3 is a P-type channel stopper region which is formed in the well region 13 below the field insulating film 2 thereby to prevent the leaking phenomena between the semiconductor elements by a parasitic MISFET.

Indicated at numeral 4 is an insulating film which is formed on the main surface of the substrate 1 in the region to be formed with a MISFET. This insulating film 4 is used mainly as a gate insulating film to form a part of the MISFET.

A first level conducting layer 5 is formed on the insulating film 4 and used mainly as the gate electrode thereby to form a part of the MISFET.

Indicated at numeral 6 are insulating side walls, or side wall spacers, which are formed on the gate insulating film 4 mainly at both the sides of the first level conducting layer 5, i.e., the gate electrode, and in self-alignment with the gate electrode. The side walls 6 space farther the paired semiconductor regions, which are used as a drain or source region, to retain a sufficient effective channel length.

Indicated at numeral 7 is an N+-type first semiconductor region, the end portion of which at the side of the region to be formed with the channel is formed in the main surface of the substrate 1 at or outside of the end portion of the first level conducting layer or the gate electrode 5. The semiconductor region 7 is used as the source region or the drain region thereby to form a part of the MISFET. Indicated at numeral 8 is an N−-type second semiconductor region which is formed to cover the first semiconductor region 7 (that is, to extend deeper into the substrate so as to be interposed between well region 13 and semiconductor substrate 7). The semiconductor region 8 weakens the electric field, which is established in the vicinity of the boundary between the region to be formed with the channel, extending to the main surface of the substrate 1, and the first semiconductor region, i.e., the drain region 7, thereby to suppress fluctuations of the threshold voltage of the MISFET by hot carriers. The N-channel MISFET is constructed of the substrate 1, the insulating film 4, the first level conducting layer 5 and paired semiconductor regions 7 and 8.

Indicated at numeral 15 are P+-type third semiconductor regions which are formed in the main surface portion of the substrate 1 at both sides of the conducting regions 5 of the region to be formed with a P-channel MISFET and which are used as the drain region or the source region thereby to form a part of the P-channel MISFET. The P-channel MISFET is constructed of the substrate 1, the insulating film 4, the conducting layer 5 and the paired semiconductor regions 15.

Indicated at numeral 9 is an insulating film which is formed on the substrate 1 in a manner to cover the semiconductor elements thereby to electrically separate the second level conducting layer, formed over the upper portion thereof, and the semiconductor element. The insulating film 9 on the predetermined first semiconductor region 7 is locally removed to form a contact hole 9A. This contact hole 9A is provided to electrically connect the first semiconductor region 7 and the second level conducting layer.

Indicated at numeral 10 is the second level conducting layer which is electrically connected with the predetermined first semiconductor region 7 through the contact hole 9A and formed to extend on the insulating film 9 thereby to electrically connect the semiconductor elements, for example.

Indicated at numeral 11 is an insulating film which is formed on the insulating film 9 in a manner to cover the second level conducting layer 10 thereby to electrically separate the second level conducting layer 10 and a third level conducting layer, which third level conducting layer is not shown.

Indicated at numeral 12 is a passivation film which is formed on the insulating film 11 in a manner to cover the third level conducting layer thereby to protect mainly a third level conducting layer from the surrounding atmosphere.

Specific fabrication steps according to the first embodiment will be described in the following.

FIGS. 2 to 7 are sectional views showing essential portions of the IC at the respective fabrication steps for explaining the first embodiment of the present invention.

First of all, the substrate 1 is prepared. And, the P−-type well region 13 is formed locally in that substrate 1. Specifically, boron ions are introduced by ion implantation into the substrate 1 in the state when the surface of the substrate 1 other than the portion to be formed with the well region 13 is covered with a mask, such as a silicon nitride film or a resist film. After this, the boron ions thus implanted are thermally diffused to form the well region 13. The technique for forming such well region, including ion implantation dose and the thermal diffusion technique, is known in the art.

Boron ions are then introduced by ion implantation locally into the surface of the well region 13. After this, the field insulating film 2 is formed by local oxidization of the substrate 1 using a silicon nitride film as the mask. Simultaneously with this, boron is diffused to form a P-channel stopper region 3. The field insulating film 2 is made of a silicon dioxide film having a thickness of 6,000 to 8,000 Å. Such forming of the P-channel stopper region and field insulating film is known in the art.

Figure 2:
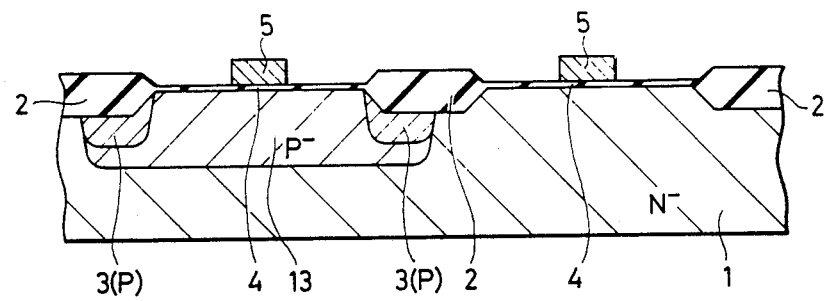
FIGS. 2 to 7 are sectional views showing respective fabrication steps for explaining an IC fabrication process for producing the IC of FIG. 1.

After removal of the silicon nitride film used for forming the field insulating film 2, the insulating film 4 is formed. This insulating film 4 is formed to have a thickness of 300 to 400 Å, comprising a silicon dioxide film which is prepared by thermally oxidizing the surface of the substrate 1, as known in the art. Then, all over the substrate 1, for example, a tungsten alloy, e.g., tungsten silicide layer, is formed to have a thickness of about 3,000 Å by the sputtering method. After this, the tungsten silicide layer is patterned by an anisotropic etching technique to form the first level conducting layer 5, as shown in FIG. 2. Although the first level conducting layer is described as being made from a tungsten silicide layer made by sputtering, the present invention is not limited thereto, and can be made from materials conventionally known for forming such layers, to be used for, e.g., gate electrodes.

Figure 3:
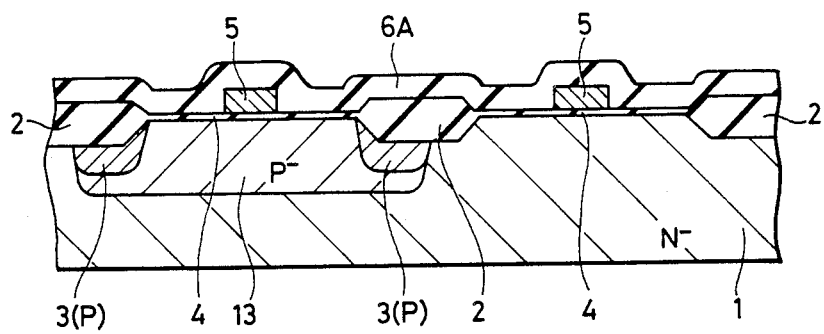

Next, as shown in FIG. 3, for example, a silicon dioxide film 6A is formed to cover the conducting layer 5. This silicon dioxide film 6A is made to have a flat portion thickness of about 3,000 Å, like that of the aforementioned conducting layer 5, by chemical vapor deposition, hereafter referred to as "CVD", whicn can provide a generally even thickness.

Figure 4:
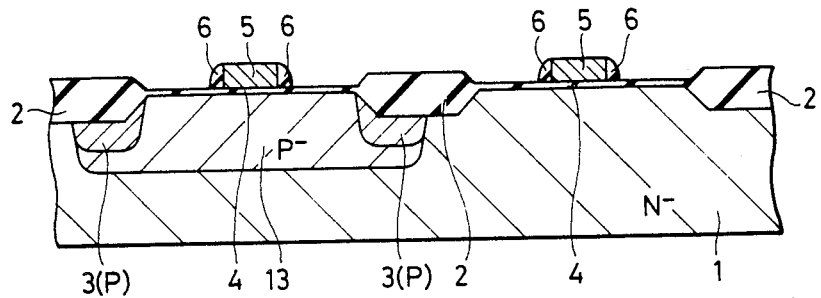

And, the silicon dioxide film 6A is removed from its surface to provide an even thickness by the reactive ion etching technique (e.g., directional vertical reactive ion etching), hereinafter referred to as "RIE". As a result, as shown in FIG. 4, there are formed in self-alignment with the gate electrode the side walls 6 which have a width of 0.2 to 0.4 μm, for example. The side walls 6 may be formed at a fabrication step similar to the aforementioned one by using a phosphosilicate glass film, which is prepared by CVD, or a silicon dioxide or nitride film which is prepared by plasma CVD.

Figure 5:
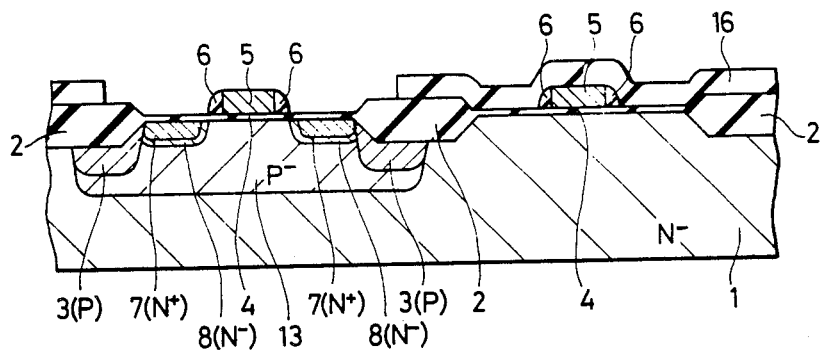

Next, the region to be formed with the P-channel MISFET is covered with a mask such as a silicon nitride film 16. In this state, as shown in FIG. 5, an impurity for forming the N-channel MISFET is introduced into the well region 13. Specifically, an N-type impurity is introduced into the substrate 1 by using the conducting layer 5 and the side walls 6 as a mask for impurity introduction. At first, phosphorus ions in a concentration of $0.5 \times 10^{16}$ atoms/cm$^2$, for example, are implanted into the main surface of the substrate 1 through the insulating film 4 by an energy of about 80 KeV. Then, arsenic ions in a concentration of about $10^{17}$ to $10^{18}$ atoms/cm$^2$ are implanted into the main surface of the substrate 1 through the insulating film 4 by an energy of about 50 to 80 KeV. By an annealing treatment, then, the aforementioned impurities are diffused to form the N+-type first semiconductor region 7 and the N−-type second semiconductor region 8, as shown in FIG. 5. The second semiconductor region 8 is formed to cover the first semiconductor region 7 because the phosphorus ions have a higher diffusion velocity than that of the arsenic ions.

Since the impurity ions are introduced by using the conducting layer 5 and the side walls 6 as a mask for impurity introduction, the first semiconductor region 7 and the second semiconductor region 8 extend around into the region to be formed with the channel to a lesser degree (that is, diffusion into the region to be the channel region is suppressed). As a result, the source region and the drain region of the MISFET constructed of the first semiconductor region 7 and the second semiconductor region 8 can be spaced from each other so that a sufficient effective channel length can be retained to prevent the short channel effect. Moreover, the first semiconductor region 7 and the second semiconductor region 8 have their depth differences (xj) as small as 0.1 to 0.2 $\mu$m, because their depths are determined by the diffusion velocities of the impurities. As a result, mutual conductance during the operation of the MISFET can be prevented from falling off, thereby speeding up the operation of the IC.

Figure 6:
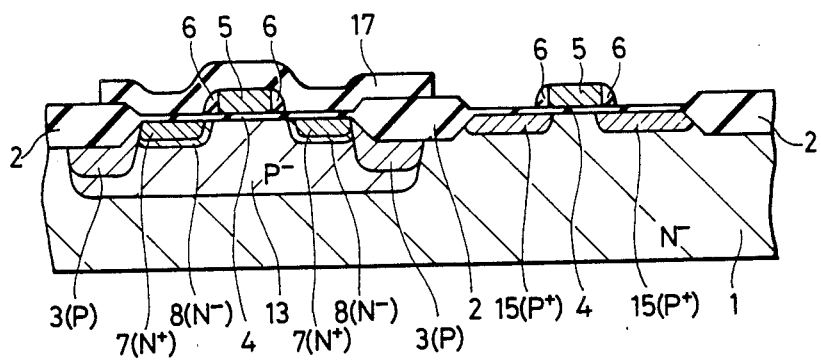

After removal of the mask 16, the region formed with the N-channel MISFET, i.e., the well region 13, is covered with a mask such as a silicon nitride film 17. In this state, as shown in FIG. 6, an impurity for forming the P-channel MISFET is introduced into the substrate 1. By using the conducting layer 5 and the side walls 6 as the mask for impurity introduction, specifically, a P-type impurity such as boron (B) is introduced into the main surface of the substrate 1 through the insulating film 4 by using ion implantation, as known in the art. By thermally diffusing the impurity introduced, moreover, the P+-type source and drain regions 15 are formed, as shown in FIG. 6.

The diffusion velocity of the boron ions for forming the P+-type semiconductor regions 15 is higher than that of the phosphorus ions for forming the second semiconductor region 8. As a result, the P-channel MISFET is liable to induce the short channel effect.

In the present embodiment, however, the conducting layer 5 and the side walls 6 are used as the mask for the impurity introduction even in the P-channel MISFET, too, like the aforementioned N-channel MISFET. As a result, the third semiconductor regions 15 will, to a lesser extent than previously, extend around into the portion to be formed with the channel, thereby to retain sufficient effective channel length of the P-channel MISFET so that the short channel effect can be prevented.

After removal of the mask 17, the insulating film 9 is formed to cover the conducting layer 5. This insulating film 9 is formed, e.g., of a phosphosilicate glass film to have a thickness of 5,000 to 6,000 Å by CVD, for example. Moreover, the insulating film 9 on the predetermined first semiconductor region 7 is locally removed, by known techniques, to form the contact hole 9A.

Figure 7:
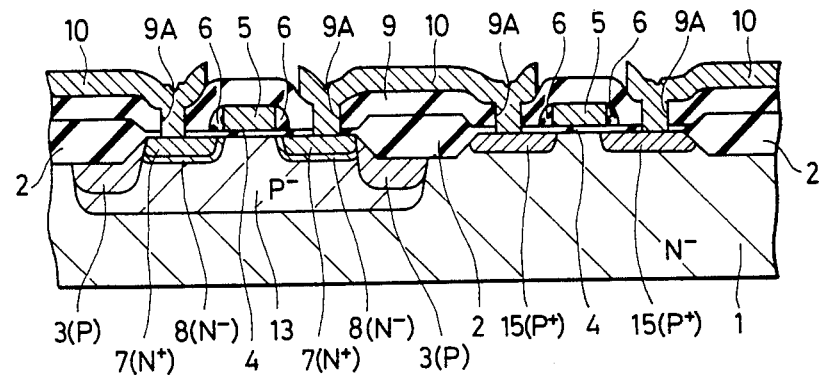

Next, as shown in FIG. 7, the second level conducting layer 10 is formed on the insulating film 9 such that it is electrically connected with the first semiconductor region 7 through the contact hole 9A. This second level conducting layer 10 is formed of a conducting layer, which is made of aluminum or its alloy by the sputtering method, for example, to have a thickness of 3,000 to 4,000 Å.

Next, the insulating film 11 is formed. This glass film, which is prepared by CVD, to have a thickness of about 8,000 to 9,000 Å. After the third level conducting layer is formed at a step similar to the second level conducting layer 10, moreover, the passivation film 12 is formed, as shown in FIG. 1. This passivation film 12 is formed, e.g., of phosphosilicate glass, which is prepared by CVD, for example, to have a thickness of about 8,000 to 9,000 Å.

The IC according to the first embodiment is completed by a series of fabricating steps thus far described.

Figure 8:
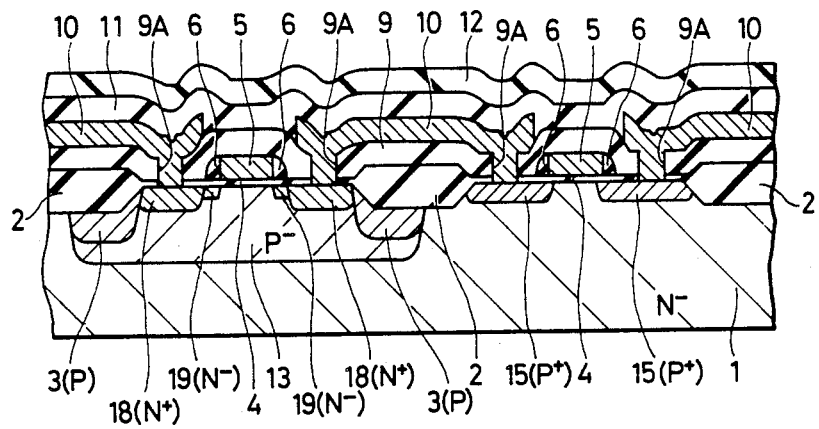
FIG. 8 is a sectional view showing an IC equipped with a complementary MISFET for explaining a second embodiment of the present invention.

FIG. 8 is a sectional view showing an essential portion of the IC provided with a CMIS for explaining a second embodiment of the present invention.

In FIG. 8, the N-channel MISFET adopts an LDD (i.e., lightly doped drain) structure. This LDD structure is disclosed in IEEE TRANSACTIONS ON ELECTRON DEVICES, VOL.ED-29, No. 4, (April 1982) pp. 590–596, by Paul J. Tsang, et al. According to this LDD structure, it is possible to prevent fluctuations of the threshold voltage by hot carriers.

The source or drain region of the N-channel MISFET of FIG. 8 is formed of a fourth semiconductor region 18 having a high impurity concentration (of N+-type), and a fifth semiconductor region 19 which has a lower impurity concentration (of N−-type) than the former and which is formed between the fourth semiconductor region 18 and a region to be formed with a channel.

Next, fabrication steps according to the second embodiment will be described in the following.

P−-type well region 13, the field insulating film 2, the channel stopper region 3, the gate insulating film 4 and the gate electrode 5 are formed at steps similar to those of the first embodiment.

Figure 9:
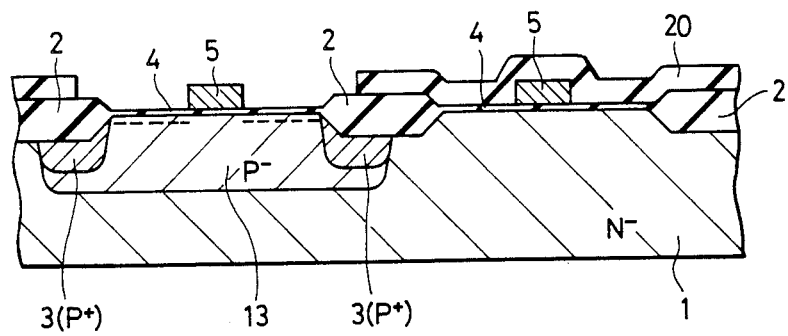
FIGS. 9 and 10 are sectional views showing respective fabrication steps for explaining an IC fabricating process for forming the IC of FIG. 8.

Next, the region to be formed with the P-channel MISFET is covered with a mask such as a resist film 20. In this state, as shown in FIG. 9, an N-type impurity such as phosphorus is introduced into the well region 13 by ion implantation using the gate electrode 5 as the mask.

After removal of the resist film 20, the side walls 6 made of a silicon dioxide film are formed in accordance with the steps shown in FIGS. 3 and 4.

Figure 10:
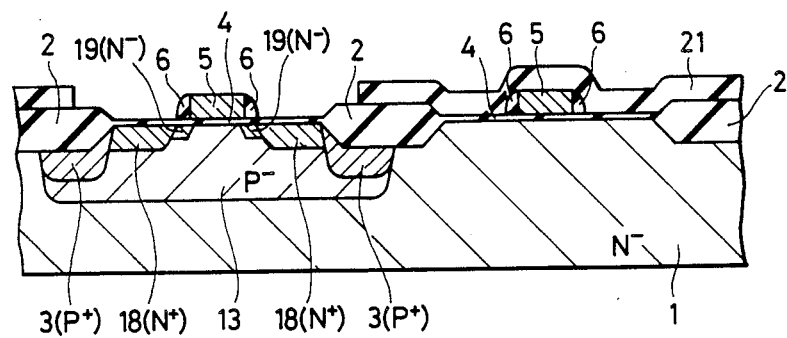

Next, the region to be formed with the P-channel MISFET is covered again with a mask such a silicon nitride film 21. In this state, an N-type impurity such as arsenic is introduced into the well region 13 by ion implantation using the gate electrode 5 and the side walls 6 as the mask. Then, the phosphorus and arsenic thus introduced are thermally diffused to form the N−-type semiconductor region 19 and the N+-type semiconductor region 18, as shown in FIG. 10.

After this, the P-channel MISFET is formed at the same steps as that of the first embodiment.

The following effects can be attained according to the novel technique thus far disclosed.

In the P-channel MISFET, the impurities are introduced by forming side walls at both sides of the gate electrode so that the source region and the drain region can be prevented from extending around into the region to be formed with the channel. As a result, the effective channel length of the P-channel MISFET can be retained at a sufficient level.

In the IC provided with the CMIS, effects similar to the aforementioned ones can be attained for the N-channel MISFET and the P-channel MISFET, respectively, as a result of introducing the impurities by forming the side walls at both sides of the gate electrode for forming both the N- and P-channel MISFETs.

Since the sufficient effective channel length can be retained for the MISFETs thanks to the aforementioned effects, the short channel effect can be prevented. As a result, moreover, the MISFETs can have their sizes reduced to improve the integration of the IC.

As can be appreciated, although the present invention has been described specifically in connection with embodiments thereof, it should not be limited to those impurities have been disclosed previously as being performed by ion implantation, but such introduction may be effected by thermal diffusion to form the source or drain regions of the MISFETs. Moreover, the present invention can also be applied to the IC which is formed with an N-channel MISFET in a P-type semiconductor substrate and a P-channel MISFET in an N-type well region.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

What is claimed is:

1. A process for fabricating a semiconductor integrated circuit device, comprising the steps of:
    (a) providing a semiconductor substrate, said substrate having a well region in a surface region of the substrate, leaving a portion of the semiconductor substrate surface region in which the well region is not formed, the well region being of conductivity type opposite that of said portion of the semiconductor substrate surface region, said substrate having gate oxide films, formed on said well region and on said portion, where semiconductor elements are to be formed;
    (b) forming gate electrodes for metal insulator semiconductor field effect transistors both on the gate oxide films on the well region and on said portion of the semiconductor substrate surface region, each gate electrode having opposed sides and adapted to have a channel region in a surface region of the respective well region and semiconductor substrate beneath each gate electrode;
    (c) forming side wall spacers at each side of each of the gate electrodes;
    (d) introducing a first impurity, of conductivity type the same as that of the semiconductor substrate, into the well region without introduction into said portion of the semiconductor substrate surface region, using the gate electrode on the well region and its respective side wall spacers as a mask;
    (e) introducing a second impurity, of conductivity type the same as that of said first impurity, into the well region without introduction into said portion of the semiconductor substrate surface region, using the gate electrode on the well region and its respective side wall spacers as a mask, the second impurity having a lower diffusion speed in the well region than the first impurity;
    (f) diffusing the first and second impurities into the well region, to form first and second semiconductor regions, respectively. therein, whereby, due to the different diffusion speeds in the well region, the first semiconductor region covers the second semiconductor region; and
    (g) introducing a third impurity, of conductivity type the same as the well region, into said portion of the semiconductor substrate surface region, using the gate electrode on said portion and its respective side wall spacers as masks, so as to form third semiconductor regions, whereby complementary metal insulator semiconductor field effect transistor can be formed in the semiconductor substrate, and whereby the side wall spacers suppress the first, second and third semiconductor regions from extending underneath the gate electrodes.

2. A process according to claim 1, wherein said side wall spacers are made of an insulating material and are formed by depositing a layer of insulating material on said gate electrodes and on the substrate and well regions, and removing the layer such that only sulating material at the sides of the gate electrodes are left.

3. A process according to claim 2, wherein said insulating material is deposited by chemical vapor deposition, and said removing is performed by reactive ion etching.

4. A process according to claim 2, wherein the removing of the insulating material is performed by reactive ion etching.

5. A process according to claim 4, including the step of forming a mask over said portion of the semiconductor substrate surface region prior to the introduction of the first and second impurities into the well region, said mask preventing introduction of first and second impurities into said portion, said mask being removed prior to introducing the third impurity into said portion of the semiconductor substrate surface region.

6. A process according to claim 4, wherein the second impurity is introduced into the well region at a higher concentration than the first impurity.

7. A process according to claim 6, wherein, prior to introduction of the third impurity into said portion of the semiconductor substrate surface region, the well region is covered with a mask for preventing introduction of the third impurity into the well region.

8. A process according to claim 7, wherein the side wall spacers are formed simultaneously on the gate electrodes formed on the well region and on said portion of the semiconductor substrate surface region.

9. A process according to claim 8, wherein all of the gate electrode, both on the well region and on said portion of the semiconductor substrate, are formed simultaneously.

10. A process according to claim 9, wherein the side wall spacers are formed of silicon oxide.

11. A process according to claim 10, wherein the first and second semiconductor regions together constitute source and drain regions for metal insulator semiconductor field effect transistor formed in the well region, and said third semiconductor regions constitute source and drain regions of metal insulator semiconductor field effect transistors formed in said portion of the semiconductor substrate surface region, and wherein said side wall spacers extend out from the sides of the gate electrode a sufficient distance so as to suppress impurity ions from moving into the channel region, such that the short channel effect is prevented.

12. A process according to claim 1, wherein said side wall spacers extend 0.2 to 0.4 μm from the sides of the gate electrodes.

13. A process according to claim 1, wherein the difference between the depth of the first semiconductor region and that of the second semiconductor region is 0.1 to 0.2 μm.

14. A process according to claim 1, wherein said well region is of p-conductivity type and the portion of the semiconductor substrate surface region is of n-conductivity type, wherein the first and second impurities are n-conductivity type impurities, and wherein said third impurity is p-type impurity.

15. A process according to claim 14, wherein the first and second impurities are phosphorus and arsenic ions, respectively, and the third impurity is boron ions.

16. A process according to claim 1, wherein the first and second semiconductor regions together constitute source and drain regions for metal insulator semiconductor field effect transistors formed in the well region, and said third semiconductor regions constitute source and drain regions of metal insulator semiconductor field effect transistors formed in said portion of the semiconductor substrate surface region, and wherein said side wall spacers extend out from the sides of the gate electrode a sufficient distance so as to suppress said impurity ions from moving into the channel region, such that the short channel effect is prevented.

* * * * *